US010890813B2

(12) United States Patent
Kawai et al.

(10) Patent No.: US 10,890,813 B2
(45) Date of Patent: Jan. 12, 2021

(54) ELECTRONIC DEVICE HAVING A FIRST ELECTRONIC COMPONENT AND A SECOND ELECTRONIC COMPONENT CONNECTED BY WIRING, AND MANUFACTURING METHOD THEREFOR

(71) Applicant: OMRON Corporation, Kyoto (JP)

(72) Inventors: Wakahiro Kawai, Konan (JP); Takafumi Bessho, Takatsuki (JP)

(73) Assignee: OMRON Corporation, Kyoto (JP)

(*) Notice: Subject to any disclaimer, the term of this patent is extended or adjusted under 35 U.S.C. 154(b) by 22 days.

(21) Appl. No.: 15/750,837

(22) PCT Filed: Nov. 8, 2016

(86) PCT No.: PCT/JP2016/083121
§ 371 (c)(1),
(2) Date: Feb. 7, 2018

(87) PCT Pub. No.: WO2017/104300
PCT Pub. Date: Jun. 22, 2017

(65) Prior Publication Data
US 2018/0231821 A1 Aug. 16, 2018

(30) Foreign Application Priority Data
Dec. 16, 2015 (JP) ................................ 2015-245565

(51) Int. Cl.
*G02F 1/1345* (2006.01)
*H01L 21/56* (2006.01)
(Continued)

(52) U.S. Cl.
CPC ........ *G02F 1/13452* (2013.01); *H01L 21/565* (2013.01); *H01L 23/552* (2013.01);
(Continued)

(58) Field of Classification Search
CPC combination set(s) only.
See application file for complete search history.

(56) References Cited

U.S. PATENT DOCUMENTS

2005/0267681 A1* 12/2005 Yato ........................ G01C 21/20 701/414
2010/0078796 A1* 4/2010 Paulus .............. H01L 23/49861 257/690

(Continued)

FOREIGN PATENT DOCUMENTS

CN 1344960 4/2002
CN 1584670 2/2005

(Continued)

OTHER PUBLICATIONS

"International Search Report (Form PCT/ISA/210) of PCT/JP2016/083121", dated Jan. 17, 2017, with English translation thereof, pp. 1-4.

(Continued)

*Primary Examiner* — Lauren Nguyen
(74) *Attorney, Agent, or Firm* — JCIPRNET

(57) ABSTRACT

Provided are an electronic device and a manufacturing method therefor such that, when connecting a first electronic component configured to have a step difference near an external connection terminal to a second electronic component via wiring, the size increase of a manufacturing device can be avoided, wiring can be carried out at a low-cost, and the reliability of the wiring connections can be improved. An LCD (10) and an IC (20) are embedded and exposed in a resin molding (30) in such a manner that a connection electrode (13*a*) of the LCD (10) and an electrode of the IC (20) are positioned on the same plane.

20 Claims, 6 Drawing Sheets

(51) Int. Cl.

| | |
|---|---|
| ***H01L 23/00*** | (2006.01) |
| ***H05K 1/18*** | (2006.01) |
| ***H01L 23/552*** | (2006.01) |
| ***H05K 1/09*** | (2006.01) |
| ***H05K 3/12*** | (2006.01) |
| ***H05K 3/32*** | (2006.01) |
| ***H05K 3/28*** | (2006.01) |
| ***G02F 1/1333*** | (2006.01) |

(52) U.S. Cl.

CPC ............. *H01L 24/96* (2013.01); *H05K 1/092* (2013.01); *H05K 1/181* (2013.01); *H05K 1/185* (2013.01); *H05K 3/12* (2013.01); *H05K 3/32* (2013.01); *G02F 2001/133388* (2013.01); *H01L 2224/04105* (2013.01); *H01L 2224/16227* (2013.01); *H01L 2224/24137* (2013.01); *H01L 2224/24195* (2013.01); *H01L 2924/14* (2013.01); *H01L 2924/15192* (2013.01); *H01L 2924/15323* (2013.01); *H01L 2924/16251* (2013.01); *H01L 2924/1815* (2013.01); *H01L 2924/19041* (2013.01); *H01L 2924/19043* (2013.01); *H01L 2924/19105* (2013.01); *H01L 2924/3025* (2013.01); *H01L 2924/3511* (2013.01); *H05K 3/284* (2013.01); *H05K 2201/09118* (2013.01); *H05K 2201/09236* (2013.01); *H05K 2201/10128* (2013.01); *H05K 2201/10136* (2013.01); *H05K 2201/10371* (2013.01); *H05K 2201/10507* (2013.01); *H05K 2203/1316* (2013.01); *H05K 2203/1327* (2013.01); *H05K 2203/1469* (2013.01)

(56) References Cited

U.S. PATENT DOCUMENTS

| | | | | |
|---|---|---|---|---|
| 2010/0238370 | A1 | 9/2010 | Matsumoto | |
| 2012/0061688 | A1* | 3/2012 | Watanabe ........... | H01L 29/1095 257/77 |
| 2012/0176564 | A1 | 7/2012 | Hatakeyama | |
| 2013/0301228 | A1* | 11/2013 | Tao ....................... | H01L 21/561 361/748 |
| 2015/0256658 | A1* | 9/2015 | Shin ..................... | G06F 1/1637 455/566 |

FOREIGN PATENT DOCUMENTS

| | | |
|---|---|---|
| CN | 102163603 | 8/2011 |
| CN | 202256972 | 5/2012 |
| EP | 0803906 | 10/1997 |
| JP | 11-120312 | 4/1999 |
| JP | 2002-76246 | 3/2002 |
| JP | 2003-281493 | 10/2003 |
| JP | 2004-206120 | 7/2004 |
| JP | 2009-204958 | 9/2009 |
| JP | 2011-101065 | 5/2011 |
| JP | 2015-207703 | 11/2015 |

OTHER PUBLICATIONS

"Written Opinion of the International Searching Authority (Form PCT/ISA/237) of PCT/JP2016/083121", dated Jan. 17, 2017, with English translation thereof, pp. 1-6.

"Search Report of Europe Counterpart Application", dated Aug. 13, 2019, pp. 1-7.

"Office Action of China Counterpart Application", dated May 28, 2020, with English translation thereof, p. 1-p. 19.

* cited by examiner

ELECTRONIC DEVICE HAVING A FIRST ELECTRONIC COMPONENT AND A SECOND ELECTRONIC COMPONENT CONNECTED BY WIRING, AND MANUFACTURING METHOD THEREFOR

CROSS-REFERENCE TO RELATED APPLICATION

This application is a 371 application of International PCT application serial no. PCT/JP2016/083121, filed on Nov. 8, 2016, which claims the priority benefit of Japan application no. 2015-245565, filed on Dec. 16, 2015. The entirety of each of the above-mentioned patent applications is hereby incorporated by reference herein and made a part of this specification.

BACKGROUND

Technical Field

The present invention relates to an electronic device, wherein a first electronic component in which an upper member is mounted in a convex shape on a wiring substrate having an external connection terminal and a second electronic component associated with an operation of the first electronic component are connected by a wiring, and a method of manufacturing the same.

Description of Related Art

In recent years, there has been increasing demand for realizing portable electronic instruments, small sensors, or healthcare instruments (such as an electronic thermometer and a sphygmomanometer) as thin, light, compact, and highly water resistant wearable products at a low cost.

Generally, such electronic instruments are constructed by incorporating a passive component (such as a resistor and a capacitor), an active component (such as an LSI and an IC), a power supply device (such as a battery), a display device (such as an LED), or other electronic components (such as a sensor and a switch) into a printed wiring substrate.

FIG. 4(*a*) and FIG. 4(*b*) shows that in such electronic components, a structure of a liquid crystal display device (LCD) that is generally used as a small display device suitable for, for example, a clinical thermometer or a mobile instrument such as a smart phone.

As shown in FIG. 4(*a*) and FIG. 4(*b*), an LCD 100 includes a color filter substrate 110 for twining an image, an array substrate 130 on which active elements such as a TFT or electrodes serving as subpixels are formed in an array form, and a liquid crystal layer 120 that is provided between these substrates and includes a flowable liquid crystal material. Power for driving the LCD 100 is supplied by wiring an external drive circuit to a connection electrode 131 exposed at an end of the array substrate 130. Therefore, the array substrate 130 is larger than the color filter substrate 110 by an exposed area of the connection electrode 131. As a result, e LCD 100, the color filter substrate 110 and the liquid crystal layer 120 are mounted in a convex shape on the array substrate 130 and the LCD 100 has a shape with a step difference near the connection electrode 131.

In the related art, as an electronic device in which an electronic component having a step difference near an electrode part such as the LCD 100 and an external drive circuit are connected to each other, an electronic device shown in FIG. 5(*a*) and FIG. 5(*b*) is known.

As shown in FIG. 5(*a*), an electronic device 200 includes the LCD 100 and a drive circuit substrate 210, wherein a drive circuit on which a drive IC 213, a chip component 214, and the like are mounted is formed on a wiring circuit 212 that is formed on a printed wiring substrate 211 including glass epoxy or a flexible substrate (for example, a polyimide). The wiring circuit 212 is connected to a back electrode 216 on a back surface of the printed wiring substrate 211 through a through-hole 215. When the back electrode 216 and the connection electrode 131 of the LCD 100 are bonded to each other using a bonding member 220 such as an anisotropic conductive adhesive, the LCD 100 and the drive circuit are connected to each other.

As shown in FIG. 5(*b*), an electronic device 300 has a configuration similar to that of the electronic device 200. That is, the electronic device 300 includes a drive circuit substrate 310 having a configuration wherein the drive circuit substrate 210 is inverted upside down, and has a structure in which a wiring circuit 312 formed on a printed wiring substrate 311 of the drive circuit substrate 310 and the connection electrode 131 of the LCD 100 face each other and these are bonded to each other using the bonding member 220. According to the electronic device 300, there is no need to form the through-hole 215 and the back electrode 216 on the drive circuit substrate 310, and it is possible to reduce manufacturing costs.

However, in the electronic device 200 and the electronic device 300, in processes of manufacturing these components, a space for installing the bonding member 220, a space for performing a bonding process, and the like are necessary. Therefore, there are problems in that the size of a manufacturing device increases, bonding operations are complicated, and manufacturing costs increase. In addition, in order to deal with a problem related to the reliability such as insufficient bonding strength, there is a problem in which another member is necessary to prevent deformation of a bonding part.

As an electronic device that addresses such problems, an electronic device shown in FIG. 5(*c*) is known.

As shown in FIG. 5(*c*), an electronic device 400 has a configuration on which the LCD 100, the drive IC 213, the chip component 214, and the like are mounted on a single printed wiring substrate 411. A wiring circuit 412 constituting the drive circuit and the connection electrode 131 of the LCD 100 are connected to each other using a conductive member 420 made of solder or the like. Therefore, it is possible to simplify the manufacturing process of the electronic device 400.

CITATION LIST

Patent Literature

[Patent Literature 1] Japanese Unexamined Patent Application Publication No. 2004-206120 (published Jul. 22, 2004).

SUMMARY

Technical Problem

However, in the electronic device 400, the printed wiring substrate 411 is enlarged, and thus there is a limit in dealing with a problem of an increase in size of the manufacturing device. Moreover, there are the following problems.

A step difference corresponding to the thickness of the array substrate 130 of the LCD 100 is provided between the connection electrode 131 and the wiring circuit 412. In addition, generally, a plurality of connection electrodes 131 are provided, for example, at a pitch of 1 mm. Therefore, under a condition in which the step difference is provided, when the connection electrode 131 and the wiring circuit 412 are connected, there are problems in that there is a high likelihood of the conductive member 420 being bridged and the reliability of connection decreasing. In addition, since it is necessary to fix members using a thermocompression sheet or the like, a space and device are still necessary to perform a bonding process and manufacturing costs are high.

As shown in FIG. 6, as another electronic device, in a display module 500 disclosed in Patent Literature 1, an array substrate 511 of an LCD 510 is enlarged, and a driver element 520 such as a drive IC and a chip component is mounted on the array substrate 511. In addition, connection to an external circuit is performed by a connection terminal 511*a* formed on the back surface of the array substrate 511. However, in such an electronic device, it is necessary to mount and process simultaneously a color filter and a liquid crystal layer which are constituent members of the LCD 510, and the driver element 520. Therefore, it is not possible to use mass-produced inexpensive general-purpose components and there is a problem of manufacturing costs increasing. In particular, in such a small terminal such as a wearable product, it is difficult to obtain a profit without lowering manufacturing costs, and reduction in manufacturing costs becomes very important.

The present invention has been made in view of the above problems in the related art, and an object of the present invention is to provide an electronic device, wherein a first electronic component having a shape with a step difference near an external connection terminal and a second electronic component associated with an operation of the first electronic component are connected by a wiring so that it is possible to avoid an increase in size of the manufacturing device and it is possible to perform wiring at low cost, and it is possible to increase the reliability of wiring connection and a method of manufacturing the same.

Solution to Problem

In order to address the above problems, the electronic device according to an embodiment of the present invention is an electronic device, wherein a first electronic component in which an upper member is mounted in a convex shape on a wiring substrate having an external connection terminal and a second electronic component associated with an operation of the first electronic component are connected by a wiring, and the first electronic component and the second electronic component are exposed so that an external connection terminal of the first electronic component and an electrode of the second electronic component are positioned on the same surface and are embedded in a resin molded body.

Advantageous Effects of Invention

The present invention has an effect of providing an electronic device wherein a first electronic component having a shape with a step difference near an external connection terminal and a second electronic component associated with an operation of the first electronic component are connected by a wiring, so that it is possible to avoid an increase in size of the manufacturing device and it is possible to perform wiring at low cost, and it is possible to increase the reliability of wiring connection and a method of manufacturing the same.

DESCRIPTION OF THE EMBODIMENTS

Embodiment 1

An embodiment of the present invention will be described below with reference to FIG. 1(*a*), FIG. 1(*b*) and FIG. 2(*a*) to FIG. 2(*e*).

In the present embodiment, as an example of an electronic device of the present invention, an electronic device on which a liquid crystal display device (LCD) is mounted will be described.

Here, while an electronic device on which a liquid crystal display device (LCD) is mounted will be described as an example of the electronic device in the present embodiment, the electronic device of the present invention is not limited thereto. The present invention can be applied to mounting of an electronic component having a shape with a step difference near an external connection terminal. Specifically, the present invention can be applied to an electronic device such as a portable electronic instrument, a small sensor, or a healthcare instrument such as an electronic thermometer and a sphygmomanometer in addition to a liquid crystal display device (LCD), and a method of manufacturing the same.

<Configuration of Electronic Device on which LCD is Mounted>

A configuration of an electronic device 1A according to the present embodiment will be described with reference to FIG. 1(*a*) and FIG. 1(*b*). FIG. 1(*a*) is a plan view showing a schematic configuration of an electronic device according to Embodiment 1 of the present invention and FIG. 1(*b*) is a side cross-sectional view.

Figure 1A:
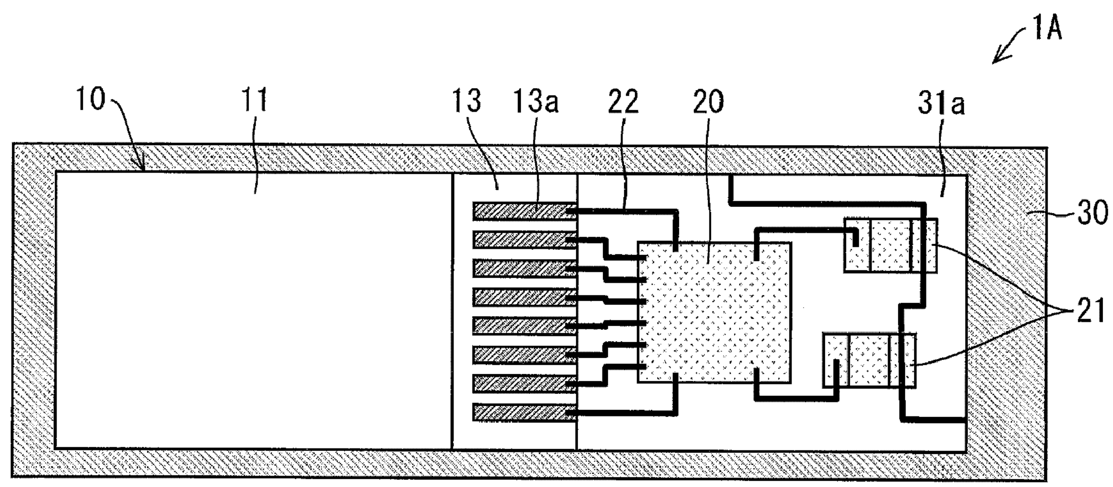
FIG. 1(*a*) is a plan view showing a schematic configuration of an electronic device according to Embodiment 1 of the present invention and FIG. 1(*b*) is a side cross-sectional view.
Figure 1B:
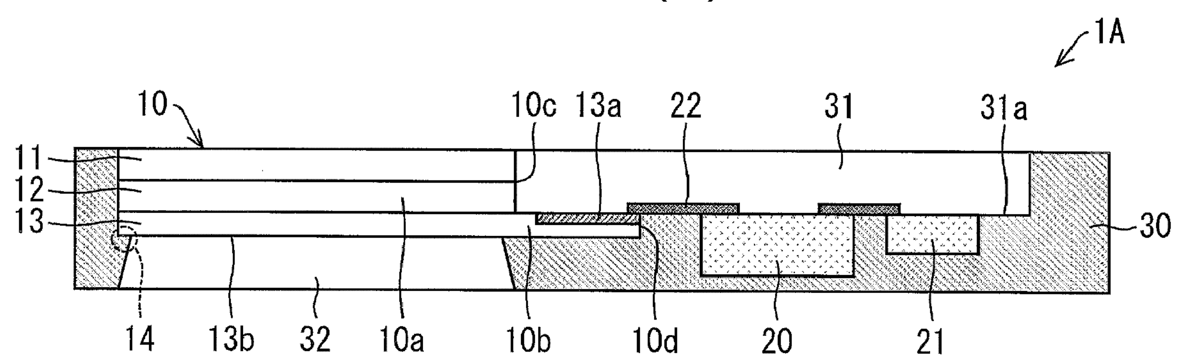
Figure 2A:
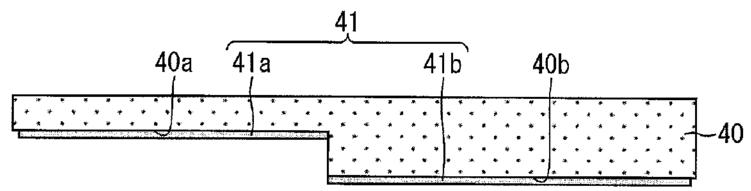
FIG. 2(*a*), FIG. 2(*b*), FIG. 2(*c*), FIG. 2(*d*), and FIG. 2(*e*) are side cross-sectional views explaining an example of a method of manufacturing the electronic device.
Figure 2B:
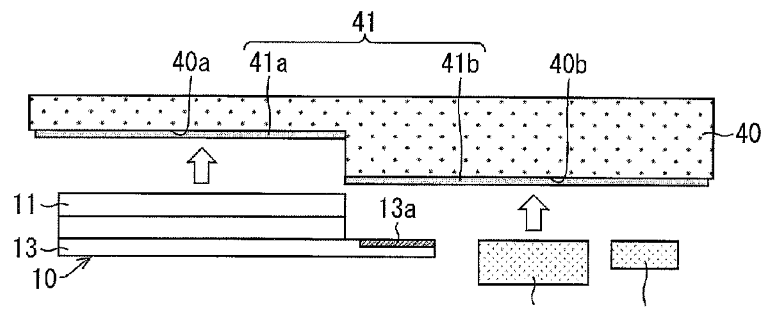
Figure 2C:
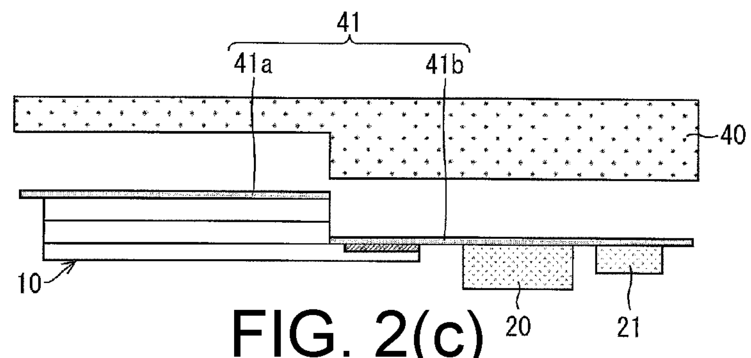
Figure 2D:
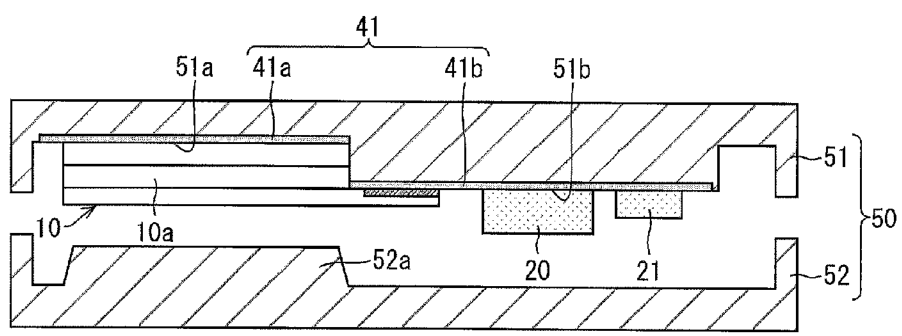
Figure 2E:
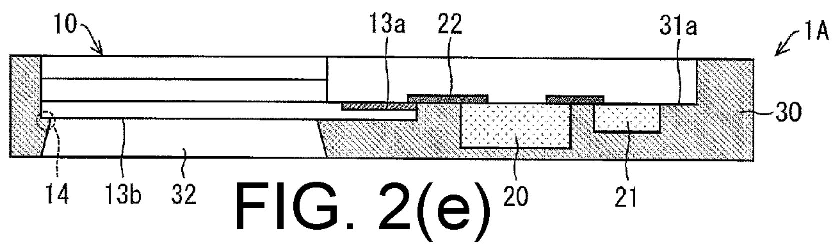

As shown in FIG. 1(*a*) and FIG. 1(*b*), the electronic device 1A of the present embodiment includes an LCD 10 which is a first electronic component, an IC 20 and a chip component 21 which are second electronic components associated with an operation of the LCD 10, and a resin molded body 30 that is formed to fix the components. In the electronic device 1A, the LCD 10, the IC 20, and the chip component 21 are connected by a wiring.

(LCD)

The LCD 10 includes a color filter substrate 11 for forming an image, an array substrate 13 on which active elements such as a TFT or display electrodes serving as subpixels are formed in an array form (arrangement), and a liquid crystal layer 12 that is provided between the color filter substrate 11 and the array substrate 13 and includes a flowable liquid crystal material. Here, while the LCD 10 of the present embodiment is assumed to be a reflective type, the present invention is not necessarily limited thereto, and a backlight type may be used. In addition, in the LCD 10 of the present embodiment, the color filter substrate 11 for color display is provided. However, the present invention is not necessarily limited thereto, and a monochrome display may be used. In this case, generally, instead of the color filter substrate 11, an upper substrate such as a glass substrate is provided as a protective member.

The array substrate 13 has a larger area than the color filter substrate 11 and the liquid crystal layer 12. At an end of the array substrate 13, a connection electrode 13*a* as an external connection terminal that is exposed to the outside is provided. When an external drive circuit is connected to the connection electrode 13*a* by wiring, power for driving the LCD 10 is supplied.

The LCD 10 is an electronic component having a shape with a step difference. The LCD 10 includes a thick part 10*a* having a relatively large thickness and a thin part 10*b* having a relatively thin thickness, and a first step portion 10*c* that is provided at a boundary between the thick part 10*a* and the thin part 10*b*.

The thick part 10*a* is a part on which the color filter substrate 11 and the liquid crystal layer 12 as upper members are mounted in a convex shape on the array substrate 13, and the thin part 10*b* is a part on which no upper member is provided. The thick part 10*a* functions as an image display unit of the LCD 10.

In addition, the LCD 10 includes a second step portion 10*d* making up the thickness of the array substrate 13.

(IC and Chip Component)

The IC 20 is an electronic component for controlling and driving the LCD 10, and the chip component 21 is an electronic component such as a resistor and a capacitor. Here, the second electronic components such as the IC 20 and the chip component 21 are not limited thereto, and, for example, a passive component (such as a resistor and a capacitor), an active component (such as an LSI and an IC), a power supply device (such as a battery), a display device (such as an LED), or other electronic components (such as a sensor and a switch) may be used. In addition, a plurality of ICs 20 and chip components 21 may be provided.

An IC electrode (not shown) is provided on a surface of the IC 20, and a chip component electrode (not shown) is provided on a surface of the chip component 21. Here, a plurality of IC electrodes and chip component electrodes may be provided.

(Resin Molded Body)

The resin molded body 30 is made of a resin such as polycarbonate (PC) or acrylonitrile butadiene styrene (ABS) and is a rectangular resin molded body having a hole 31 provided therein. Here, the resin constituting the resin molded body 30 is not limited thereto.

At the bottom of the hole 31, the array substrate 13 of the LCD 10, the IC 20, and the chip component 21 are embedded so that electrodes are exposed. Here, a bottom surface of the hole 31 is defined as a hole bottom surface 31*a*.

That is, the resin molded body 30 covers a side surface and a bottom surface of the IC 20, and a surface of the IC 20 and the IC electrode are exposed from the hole bottom surface 31*a*. Similarly, the resin molded body 30 covers a side surface and a bottom surface of the chip component 21 and a surface of the chip component 21 and the chip component electrode are exposed from the hole bottom surface 31*a*.

In addition, the resin molded body 30 covers a side surface of the array substrate 13 in the LCD 10 and covers at least a part of the bottom surface. Then, among four surfaces which are side surfaces of the color filter substrate 11 and the liquid crystal layer 12, the resin molded body 30 covers three surfaces other than a surface on the side in which the connection electrode 13*a* is provided on the array substrate 13.

Accordingly, since the resin molded body 30 is formed in a concave shape and covers a peripheral part of the electronic device 1A, it is possible to improve the mechanical strength of the electronic device 1A.

Here, the hole bottom surface 31*a* may have a flat surface shape, and may be bent and have a plurality of flat surfaces, or have a gently curved surface. The shape of the resin molded body 30 is not limited to a rectangular shape and may be other shapes.

In addition, in the resin molded body 30, an opening 32 is formed in an area of the thick part 10*a* of the LCD 10 on which an upper member is provided. Therefore, display towards the back surface of the electronic device 1A, that is, the lower side in FIG. 1(*b*) is made possible.

Here, in the electronic device of the present invention, as described in Embodiment 2 to be described below, application to an electronic device on which a substrate module without the opening 32 is mounted is possible. Therefore, in the electronic device of the present invention, the opening 32 is not essential for the configuration, but it may be provided as necessary.

When a surface of the array substrate 13 exposed to the outside through the opening 32 is defined as an exposed back surface 13*b*, the resin molded body 30 is formed to cover a peripheral part of the exposed back surface 13*b*. In other words, the resin molded body 30 covers a bottom edge and a peripheral part of the array substrate 13 of the area of the thick part 10*a*, which is an area in which the upper member is provided. That is, an area of the exposed back surface 13*b* is smaller than an area of the array substrate 13 of the area of the thick part 10*a*. A part covered with the resin molded body 30 at the bottom edge and the peripheral part of the array substrate 13 of the area of the thick part 10*a* is defined as a resin-covered part 14. Here, the bottom edge of the array substrate 13 of the area of the thick part 10*a* is a part on the bottom side at a corner between a bottom surface and a side surface of the array substrate 13. The peripheral part of the array substrate 13 of the area of the thick part 10*a* is a side surface part of the array substrate 13.

In the electronic device 1A of the present embodiment having the above configuration, an electronic component having a shape including the first step portion 10*c* and the second step portion 10*d* near the connection electrode 13*a* of the LCD 10 is mounted so that the connection electrode 13*a*, the IC electrode, and the chip component electrode are on the same surface as the hole bottom surface 31*a*. The same surface is a circuit formation surface. The circuit formation surface has no step difference for preventing circuit formation.

Here, "on the same surface as the hole bottom surface 31*a*" and "has no step difference" do not strictly mean that there is no step difference between the hole bottom surface 31*a* and any of the surface of the connection electrode 13*a*, the surface of the IC electrode and the surface of the chip component electrode, that is, the step difference does not need to be completely zero. For example, a minute step difference that is inevitably formed in the manufacturing process is allowed. Specifically, the circuit formation surface may be flat to an extent at which it is possible to form a circuit including the connection electrode 13*a*, the IC electrode, and the chip component electrode by print printing using an ink jet printer on the circuit formation surface.

Therefore, for example, using print printing such as injecting a conductive material (for example, a conductive ink such as a silver ink) for wiring using an ink jet printer or the like, it is possible to form a wiring circuit 22 on the circuit formation surface at low cost. Here, it is possible to form the wiring circuit 22 using another method such as a metal wiring.

In addition, since the wiring circuit 22 can be formed on the circuit formation surface, it is possible to increase the reliability of connection. That is, even if connection electrodes 13*a* with a narrow pitch are wired, the likelihood of a wiring being bridged is reduced.

Thus, a printed wiring substrate and a conductive member in the related art are not necessary, and a bonding process in which a drive circuit of the printed wiring substrate and the connection electrode 13*a* are bonded to each other using a conductive member is not necessary. Therefore, it is not necessary to secure a space necessary for the bonding process, and it is possible to prevent the size of a manufacturing device from increasing and manufacturing costs from increasing.

In addition, the wiring circuit 22 can be formed when positions of the connection electrode 13*a*, the IC electrode, and the chip component electrode are determined, and can be easily wired accurately.

Furthermore, the LCD 10, the IC 20, and the chip component 21 are fixed by the resin molded body 30 and the wiring circuit 22 is also formed on the circuit formation surface. Therefore, it is possible to reduce problems such as deformation or damage of the wiring circuit 22 and insufficient bonding strength of the wiring.

Thus, even if a plurality of ICs 20 and chip components 21 are provided, electrodes of the plurality of ICs 20 and chip components 21 are on the same surface as the circuit formation surface. Therefore, the connection electrode 13*a*, the IC 20, and the chip component 21 can be wired in a desired combination on the circuit formation surface.

In addition, the electronic device 1A of the present embodiment includes the resin-covered part 14. Therefore, since the peripheral part of the exposed back surface 13*b* is covered with a resin, it is possible to prevent water or the like from entering a side surface of the LCD 10 from the opening 32. For example, a waterproof property is important for products such as a clinical thermometer and a wearable terminal installed in clothes, and the present invention can be suitably used for such products.

In addition, the resin molded body 30 may have a reduced area that is adhered to the LCD 10 due to thermal contraction after resin molding in the manufacturing process. However, since the electronic device 1A of the present embodiment includes the resin-covered part 14, adhesion between the resin molded body 30 and the LCD 10 is easily maintained. As a result, fixation of the LCD 10 by the resin molded body 30 is promoted, and the mechanical strength is improved.

In addition, since the shape and the depth of the hole 31 can be changed according to the shape and the height of the first electronic component and the second electronic component, it is possible to freely select the first electronic component and the second electronic component. Therefore, it is possible to use an inexpensive and mass-produced electronic component that is generally commercially available. Therefore, it is possible to reduce manufacturing costs of the electronic device.

The depth of the hole 31 of the resin molded body 30 is preferably, for example, about 3 mm or less. When a distance between the circuit formation surface and a nozzle of the ink jet printer or the like is about 3 mm or less, it is possible to suitably form a printed circuit. Therefore, when the nozzle is relatively moved directly above the electronic device, it is possible to form a printed circuit. On the other hand, when a distance is too long, it is necessary for a tip of the nozzle to enter the hole 31. In this case, since it is necessary to move the nozzle up and down, in a plurality of electronic devices 1A, a time required when printed circuits are continuously formed on the electronic devices 1A increases.

In addition, in the electronic device 1A of the present embodiment, the hole bottom surface 31*a* of the resin molded body 30 is a circuit formation surface, but the electronic device of the present invention is not limited thereto. That is, the hole 31 may not be formed in the resin molded body 30. In this case, on a surface of the resin molded body 30, the connection electrode 13*a*, the IC electrode, and the chip component electrode are on the same surface, and may form a circuit formation surface.

<Method of Manufacturing Electronic Device>

A method of manufacturing the electronic device 1A of the present embodiment will be described below with reference to FIG. 2(*a*), FIG. 2(*b*), FIG. 2(*c*), FIG. 2(*d*), and FIG. 2(*e*). FIG. 2(*a*), FIG. 2(*b*), FIG. 2(*c*), FIG. 2(*d*), and FIG. 2(*e*) are side cross-sectional views explaining an example of a method of manufacturing the electronic device of the present embodiment.

As shown in FIG. 2(*a*), in the method of manufacturing the electronic device 1A of the present embodiment, first, a film (sheet member) 41 is fixed to surfaces of the first surface 40*a* and the second surface 40*b* of a jig 40 including a first surface 40*a* and a second surface 40*b* whose heights are different from each other (preliminary preparation process).

Here, in the jig 40, the second surface 40*b* has the same shape as a shape of the hole bottom surface 31*a* of the resin molded body 30 to be manufactured.

Here, "the same shape" does not mean the same without any difference in size and includes substantially the same shape. That is, there may be slight differences due to thermal expansion, thermal contraction, or the like, and this applies similarly in the following description.

As a material of the film 41, for example, polyethylene terephthalate (PET), polyethylene naphthalate (PEN), and polyphenylene sulfide (PPS) can be used. According to reasons which will follow, the film 41 is preferably made of a flexible material through which ultraviolet rays pass.

In addition, the film 41 may be a carrier tape, a glass epoxy substrate, or the like. A material of the film 41 is not particularly limited as long as it is capable of temporarily fixing an electronic component and can be peeled off after the electronic device 1A is manufactured.

As shown in FIG. 2(*b*), next, the film 41 of the first surface 40*a* is attached to and temporarily fixed to the color filter substrate 11 of the LCD 10. At the same time, the connection electrode 13*a* of the array substrate 13, an IC electrode 20*a*, and a chip component electrode 21*a* are attached and temporarily fixed to the film 41 of the second surface 40*b* so that they are in contact with the film 41 of the second surface 40*b* (attachment and temporary fixation process).

For example, the temporary fixation can be performed using, for example, an ultraviolet curable adhesive (not shown) that is applied to one surface of the film 41. Specifically, GL-3005H (commercially available from Gluelabo) as the adhesive may be applied at a thickness of 2 μm to 3 μm to, for example, a 50 μm film 41 made of PET. Then, the LCD 10, the IC 20, and the chip component 21 are positioned and installed. Then, for example, when ultraviolet rays having an intensity of 3000 mJ/cm$^2$ are emitted, the adhesive is cured, and the LCD 10, the IC 20, and the chip component 21 are temporarily fixed to the film 41.

Here, the ultraviolet rays are preferably emitted from the side of the jig 40. This is because, when ultraviolet rays are emitted from the side to which electronic components such as the LCD 10 are temporarily fixed, ultraviolet curing may be insufficient in parts in the shadow of such electronic components and the like. In this case, temporary fixation is insufficient.

Therefore, the jig 40 is preferably made of a material through which ultraviolet rays pass, for example, glass, transparent polycarbonate (PC), acrylic, or the like. When both of the jig 40 and the film 41 have ultraviolet transmittance, ultraviolet rays are emitted from the side of the jig 40, and the adhesive can be cured on the entire surface. As a result, sufficient temporary fixation can be performed.

In addition, one continuous film 41 can be used. However, in this case, since the film 41 shrinks and bends due to a step difference at the boundary between the first surface 40*a* and the second surface 40*b* of the jig 40, positional accuracy of electronic components such as the LCD 10 to be temporarily fixed may decrease. Therefore, as in the present embodiment, preferably, the film 41 is separated into a first film 41*a* used for the first surface 40*a* and a second film 41*b* used for the second surface 40*b*.

As shown in FIG. 2(*c*), after the attachment and temporary fixation process, the film 41 to which electronic components such as the LCD 10 are temporarily fixed is removed from the jig 40.

As shown in FIG. 2(*d*), next, the film 41 to which electronic components such as the LCD 10 are temporarily fixed is disposed and accommodated inside a mold 50 for manufacturing the resin molded body 30 (mold accommodation process), and resin molding is performed so that the electronic components that are temporarily fixed are embedded in the resin molded body 30 (resin molding process).

The mold 50 is a metal mold for injection molding the resin molded body 30 and includes a first mold 51 and a second mold 52.

The first mold 51 has a first surface 51*a* and a second surface 51*b* whose heights are different from each other as two surfaces corresponding to the jig 40.

A surface of the first film 41*a* that is in contact with the jig 40 is disposed on the first surface 51*a* of the first mold 51. A surface of the second film 41*b* that is in contact with the jig 40 is disposed on the second surface 51*b* of the first mold 51.

When the opening 32 is formed in the resin molded body 30, the second mold 52 includes a convex part 52*a* corresponding to the shape of the opening 32. Here, when an area of a surface of the convex part 52*a* is set to be smaller than the thick part 10*a* of the LCD 10, after resin molding, the resin-covered part 14 can be formed on a peripheral part of the exposed back surface 13*b* of the LCD.

Conditions in which injection molding is performed may be appropriately selected according to the resin constituting the resin molded body 30. For example, when polycarbonate (PC) is used, injection molding is performed at an injection resin temperature of 270° C. and an injection pressure of 100 MPa. In addition, when acrylonitrile butadiene styrene (ABS) is used, injection molding is performed at an injection resin temperature of 180° C. and an injection pressure of 20 kgf/cm$^2$.

Various resin materials can be used for the resin constituting the resin molded body 30. In addition, conditions in which injection molding is performed are not particularly limited.

As shown in FIG. 2(*e*), thereafter, the resin molded body 30 in which the LCD 10, the IC 20, and the chip component 21 are embedded is removed from the mold 50, and the film 41 is separated therefrom (removal process). Therefore, the electronic device 1A can be obtained.

In this case, when a material, for example, a PET film, is used as the film 41, since the PET film changes greatly due to a thermal change in the resin molding process, the film 41 easily separates off. This is because the film 41 that is greatly deformed due to thermal expansion and thermal contraction spontaneously separates from electronic components such as the LCD 10.

Thus, when the wiring circuit 22 is formed in the electronic device 1A, the connection electrode 13*a*, the IC electrode, and the chip component electrode which are exposed to the hole bottom surface 31*a* are wired and connected by, for example, print printing (wiring connection process).

The print printing can be performed by a method of printing by spraying a conductive material (for example, a silver ink) using, for example, an ink jet printer.

For example, in print printing using an ink jet printer, the depth of the hole 31 of the electronic device 1A of the present embodiment is about 3 mm or less. The nozzle is relatively moved directly above the electronic device 1A and the wiring circuit 22 can be formed on the hole bottom surface 31*a*.

Embodiment 2

Another embodiment of the present invention will be described below with reference to FIG. 3(*a*) and FIG. 3(*b*). Here, the configuration other than that described in the present embodiment is the same as in Embodiment 1. In addition, for convenience of explanation, members having the same functions as members shown in the drawings in Embodiment 1 are denoted with the same reference numerals, and descriptions thereof will be omitted.

In the electronic device 1A of Embodiment 1, an electronic device on which the LCD 10 as an electronic component having a shape with a step difference near an electrode part for electrical wiring is mounted has been exemplified. On the other hand, the electronic device of the present Embodiment 2 is an electronic device on which a substrate module (for example, wireless communication, various sensors, and switches) as an electronic component is mounted, which is different from the electronic device 1A of Embodiment 1.

A configuration of an electronic device 1B of the present embodiment will be described with reference to FIG. 3(*a*) and FIG. 3(*b*). FIG. 3(*a*) is a plan view showing a configuration of a substrate module in Embodiment 2 of the present invention, and FIG. 3(*b*) is a side cross-sectional view.

Figure 3A:
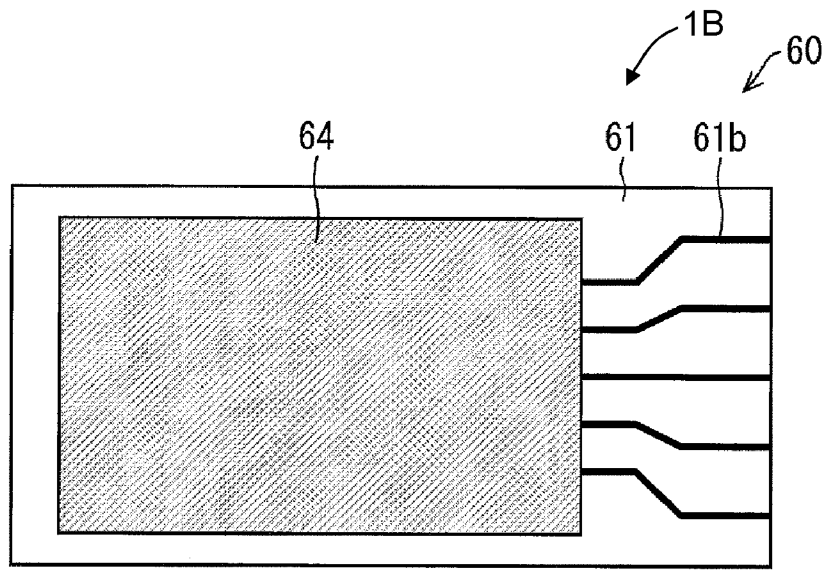
FIG. 3(*a*) is a plan view showing a configuration of an electronic device according to Embodiment 2 of the present invention and FIG. 3(*b*) is a side cross-sectional view.
Figure 3B:
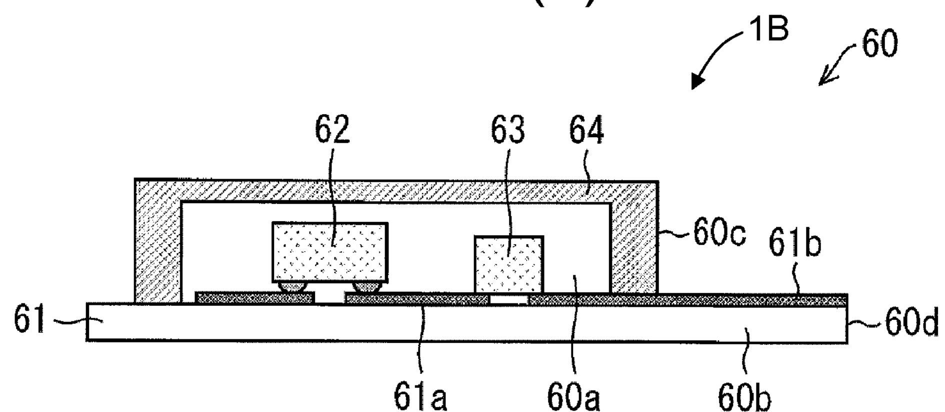
Figure 4A:
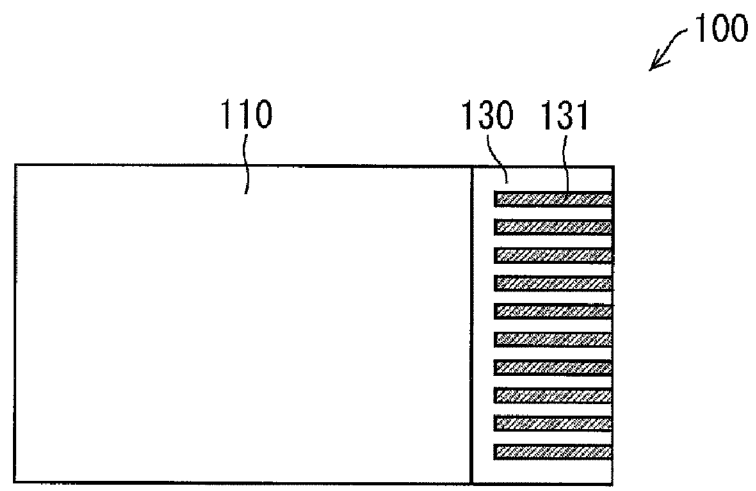
FIG. 4(*a*) is a plan view showing a schematic configuration of a liquid crystal display device of the related art, and FIG. 4(*b*) is a side cross-sectional view.
Figure 4B:
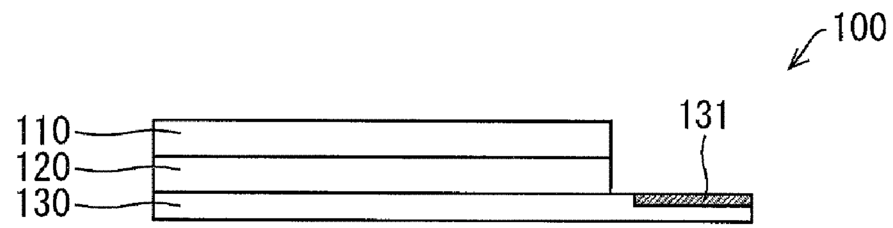
Figure 5A:
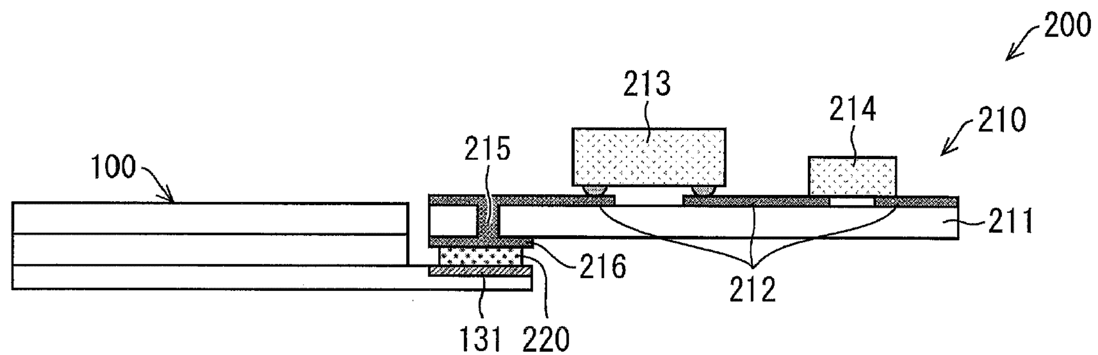
FIG. 5(*a*), FIG. 5(*b*) and FIG. 5(*c*) are side cross-sectional views showing a schematic configuration of an electronic device of the related art.
Figure 5B:
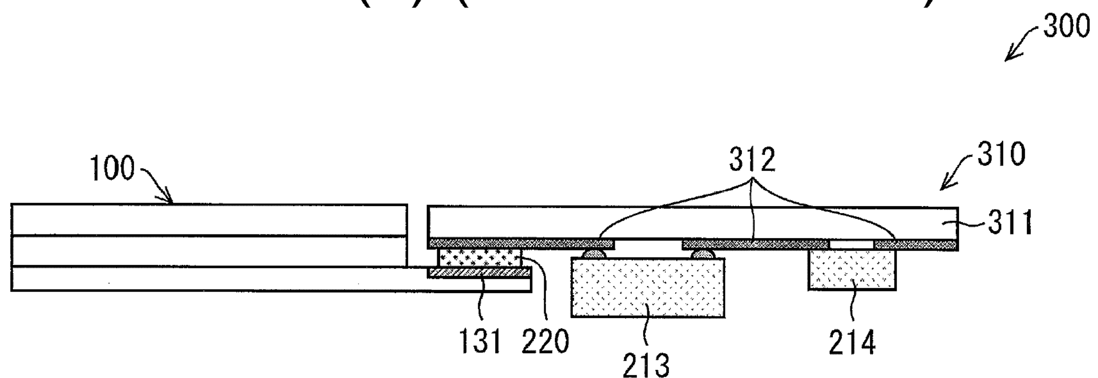
Figure 5C:
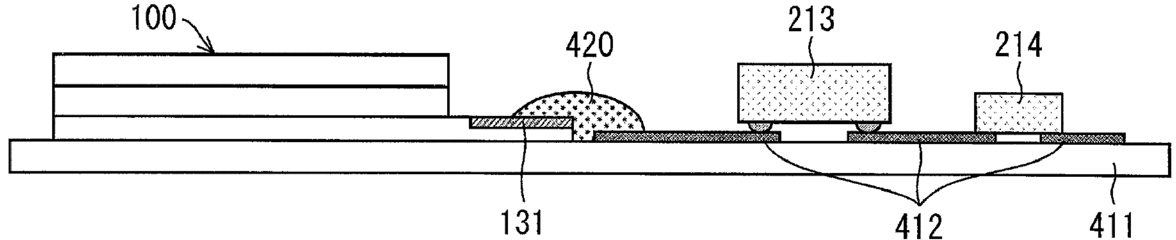
Figure 6:
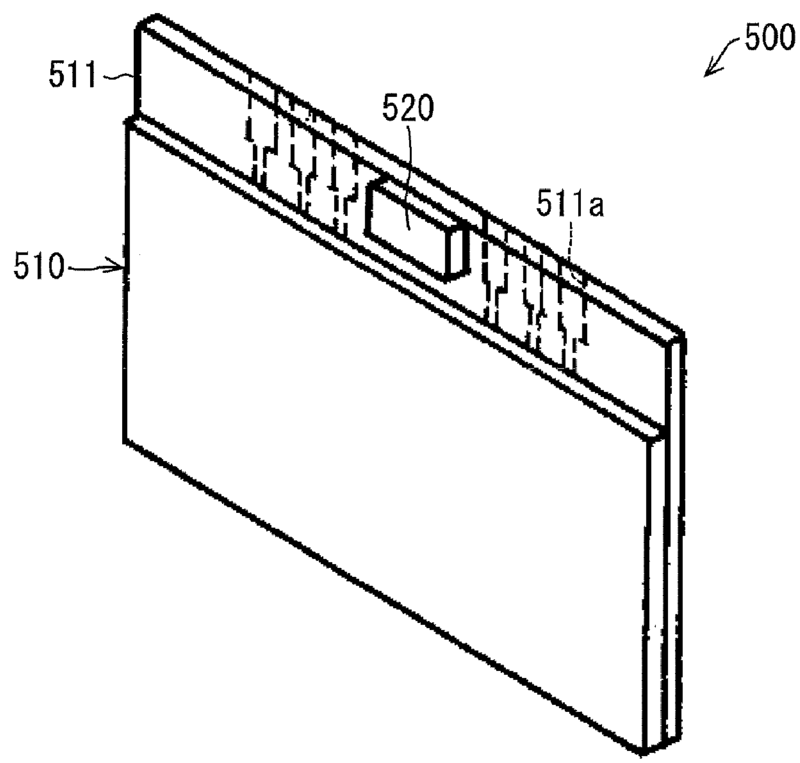
FIG. 6 is a perspective view showing a schematic configuration of the electronic device of the related art.

As shown in FIG. 3(*a*) and FIG. 3(*b*), a substrate module 60 mounted on the electronic device 1B of the present embodiment includes an IC 62, a chip component 63, and an electromagnetic shield 64 as a protective member covering them, which are mounted on a printed substrate 61 as a wiring substrate.

The substrate module 60 is an electronic component having a shape with a step difference. That is, the substrate module 60 includes a thick part 60*a* having a relatively large thickness and a thin part 60*b* having a relatively thin thickness, and a first step portion 60*c* that is provided at a boundary between the thick part 60*a* and the thin part 60*b*.

The thick part 60*a* is a part on which the electromagnetic shield 64 is provided on the printed substrate 61 and the thin part 60*b* is a part on which the electromagnetic shield 64 is not provided.

In addition, the substrate module 60 includes a second step portion 60*d* making up the thickness of the printed substrate 61.

The printed substrate 61 includes a wiring circuit 61*a* on its surface. At an end of the printed substrate 61, a connection electrode 61*b* that is exposed to the outside and is connected to the inside of the electromagnetic shield 64 is provided. When an external drive circuit is wired to the connection electrode 61*b*, power for driving the substrate module 60 is supplied.

When the LCD 10 is replaced with the substrate module 60 in the electronic device 1A of Embodiment 1 described above, the electronic device 1B can be obtained. Specifically, in the electronic device 1B, the connection electrode 61*b*, the IC electrode, and the chip component electrode are on the same surface as the surface of the resin molded body. Therefore, it is possible to provide an electronic device having the same operations and effects as in the electronic device 1A.

In addition, even if the substrate module 60 described above is used, it is possible to manufacture the electronic device 1B according to the same manufacturing method as in Embodiment 1.

As described above, the electronic device according to an embodiment of the present invention is an electronic device in which the first electronic component in which an upper member is mounted in a convex shape on a wiring substrate including an external connection terminal and the second electronic component associated with an operation of the first electronic component are connected by a wiring, and the first electronic component and the second electronic component are exposed so that an external connection terminal of the first electronic component and an electrode of the second electronic component are positioned on the same surface and are embedded in the resin molded body.

According to the above configuration, in the electronic device in which the first electronic component having a shape with a step difference near an external connection terminal and the second electronic component associated with an operation of the first electronic component are connected by a wiring, the external connection terminal of the first electronic component and the electrode of the second electronic component are on the same surface. Therefore, using a simple method such as print printing using, for example, an ink jet printer, it is possible to perform wiring at low cost.

In addition, during wiring, a conductive adhesive for connecting electrodes or the like is not necessary, and the bonding process can be omitted. Therefore, it is possible to reduce manufacturing costs. Thus, since it is not necessary to secure a space for performing such a bonding process, it is possible to prevent the size of the device from increasing.

Further, the first electronic component and the second electronic component are fixed to the resin molded body and the wiring circuit can be formed on the resin molded body without generating a step difference. As a result, it is possible to increase the mechanical strength.

Therefore, it is possible to provide an electronic device in which the first electronic component having a shape with a step difference near an external connection terminal and the second electronic component associated with an operation of the first electronic component are connected by a wiring so that it is possible to avoid an increase in size of the manufacturing device and it is possible to perform wiring at low cost, and it is possible to increase the reliability of wiring connection.

Furthermore, in the electronic device according to an embodiment of the present invention, the first electronic component is preferably embedded in the resin molded body so that the external connection terminal of the first electronic component and the electrode of the second electronic component are aligned on the same surface.

According to the above configuration, when the wiring substrate of the first electronic component is placed on the resin molded body, since the wiring substrate of the first electronic component has a certain thickness, there is a step difference between the wiring substrate and the surface of the resin molded body. Therefore, in the present invention, the first electronic component is embedded in the resin molded body so that the external connection terminal of the first electronic component and the electrode of the second electronic component are aligned on the same surface.

Therefore, the wiring substrate of the first electronic component is embedded in the resin molded body to an extent of the step difference, such that even though such a step difference is provided, it is possible to align the external connection terminal of the first electronic component and the electrode of the second electronic component on the same surface.

Furthermore, in the electronic device according to an embodiment of the present invention, a plurality of second electronic components are provided, and any electrode of the plurality of second electronic components may be on the same surface as the surface of the resin molded body.

According to the above configuration, even if a plurality of second electronic components are provided, it is possible to wire the external connection terminal and the electrode of the second electronic components on the same surface as the surface of the resin molded body. In addition, the plurality of second electronic components can be wired on the same surface as the surface of the resin molded body.

Furthermore, in the electronic device according to an embodiment of the present invention, the resin molded body has an opening that is formed in an area in which the upper member is provided and may cover a bottom edge of the upper member.

According to the above configuration, the resin molded body has an opening that is formed in an area in which the upper member is provided. Therefore, when the electronic device is a liquid crystal display device, it is possible to perform display on the side of the array substrate which is a wiring substrate.

In addition, since the bottom edge of the upper member is covered with a resin, it is possible to prevent water or the like from entering a side surface of the first electronic component from the opening. Therefore, it is possible to prevent a failure of the first electronic component due to water or the like.

In addition, when the resin covering the bottom edge of the upper member maintains adhesion between the first electronic component and the resin molded body and fixation is promoted, the mechanical strength of the electronic device can be improved.

Furthermore, in the electronic device according to an embodiment of the present invention, the first electronic component is a liquid crystal display device, the wiring substrate is an array substrate in which display electrodes are formed in an array shape, and the upper member may include an upper substrate and a liquid crystal layer that is provided between the upper substrate and the array substrate and includes a liquid crystal material.

According to the above configuration, for example, the present invention can be suitably used for small products for which a waterproof property is required such as a clinical thermometer and a wearable terminal installed in clothes. As a result, it is possible to provide an electronic device including a liquid crystal display device.

Furthermore, in the electronic device according to an embodiment of the present invention, the first electronic component is a substrate module, and the upper member may include a mounted electronic component mounted on the wiring substrate and a protective member covering the mounted electronic component.

According to the above configuration, a substrate module having various functions in the shape with a step difference near an external connection terminal can be mounted so that the external connection terminal and the electrode of the second electronic component are on the same surface. Therefore, it is possible to perform wiring at low cost and it is possible to increase the reliability of wiring connection. As a result, it is possible to provide an electronic device including a substrate module.

Furthermore, in the electronic device according to an embodiment of the present invention, the external connection terminal of the first electronic component and the electrode of the second electronic component may be connected by a wiring on the surface of the resin molded body.

According to the above configuration, like the first electronic component, regardless of the inclusion of the electronic component having a shape with a step difference near an external connection terminal, the wiring connection is performed without a step difference. Therefore, bridging of the wiring is unlikely to occur, the reliability of connection increases, and even if the resin molded body receives a deforming force for such as expanding, contraction, bending, or the like, the wiring does not easily break. Accordingly, it is possible to provide an electronic device having a wiring with a high degree of reliability.

Furthermore, in the electronic device according to an embodiment of the present invention, the wiring connection may be formed by print printing a conductive material.

According to the above configuration, wiring connection can be easily formed using a device such as an ink jet printer.

A method of manufacturing an electronic device according to an embodiment of the present invention is a method of manufacturing an electronic device, wherein a first electronic component in which an upper member is mounted in a convex shape on a wiring substrate having an external connection terminal and a second electronic component associated with an operation of the first electronic component are connected by a wiring. The method includes a preliminary preparation process in which, using a jig having a step difference corresponding to a height of the upper member with a convex shape, a sheet member is fixed to a first surface and a second surface of the jig; an attachment and temporary fixation process in which the upper member is attached to the sheet member of the first surface of the jig and the external connection terminal of the wiring substrate and the second electronic component are attached and temporarily fixed to the sheet member of the second surface of the jig; a mold accommodation process in which the sheet member after the attachment and temporary fixation process is removed from the jig while the first electronic component and the second electronic component are temporarily fixed, and is attached to the inside of an upper mold and accommodated; and a resin molding process in which resin molding is performed so that the first electronic component and the second electronic component are embedded between the upper mold and a lower mold.

According to the above configuration, when the first electronic component and the second electronic component are positioned, the first electronic component and the second electronic component are temporarily fixed to the sheet member attached to the jig, and the jig is then removed, and attached to the upper mold, and a resin is injected between the upper mold and the lower mold and molded. As a result, it is possible to efficiently manufacture an electronic device of the present invention.

Therefore, when the first electronic component having a shape with a step difference near an external connection terminal and the second electronic component associated with an operation of the first electronic component are connected by a wiring, it is possible to avoid an increase in size of the manufacturing device and it is possible to perform wiring at low cost, and it is possible to provide a method of manufacturing an electronic device capable of increasing the reliability of wiring connection.

Furthermore, in the method of manufacturing an electronic device according to an embodiment of the present invention, the sheet member may be separated into at least two members including one member that is used for the first surface and one member that is used for the second surface.

According to the above configuration, the sheet member does not shrink and bend due to a step difference at the boundary between the first surface and the second surface of the jig. As a result, a likelihood of decreased positional accuracy of the first electronic component and the second electronic component is reduced.

Furthermore, the method of manufacturing an electronic device according to an embodiment of the present invention may include a removal process in which, after the resin molding process, the first electronic component, the second electronic component, and the resin molded body that is resin-molded are removed, and the sheet member is separated from the first electronic component, the external connection terminal, and the second electronic component; and a wiring connection process in which the external connection terminal and the electrode of the second electronic component which are on the same surface as the surface of the resin molded body are connected by a wiring.

According to the above configuration, it is possible to obtain an electronic device including a wiring circuit in which the first electrode and the electrode of the second electronic component are wired on the same surface as the surface of the resin molded body.

In addition, furthermore, in the method of manufacturing an electronic device of the present invention, in the wiring connection process, a conductive ink may be sprayed to print the wiring.

According to the above configuration, the first electrode and the electrode of the second electronic component are on the same surface as the surface of the resin molded body, and it is possible to form a circuit by wiring using a simple method in which a conductive material for an inkjet or the like is injected for printing. Therefore, compared to a method in which a wiring is formed using etching or the like, material costs and processing costs can be reduced to low prices. In addition, in the method in which conductive material is injected for printing, generally, it is easy to adjust a printing position. As a result, even if the position of the electronic component is deviated from a predetermined position, it is possible to form a wiring according to the deviation.

The present invention is not limited to the above-described embodiments, and various modifications can be made within the scope of the claims, and embodiments obtained by appropriately combining technical methods disclosed in different embodiments are also included in the technical scope of the present invention. Moreover, when technical methods disclosed in the embodiments are combined, new technical features can be obtained.

What is claimed is:

1. An electronic device, wherein a first electronic component includes an upper member that is mounted in a convex shape on a wiring substrate having an external connection terminal and a second electronic component associated with an operation of the first electronic component is connected to the first electronic component by a wiring, wherein the external connection terminal of the first electronic component and an electrode of the second electronic component are positioned on the same surface and are embedded in a resin molded body, and upper surfaces of the external connection terminal and the electrode of the second electronic component are exposed by a hole of the resin molded body and are configured at a bottom surface of the hole, wherein a depth of the hole of the resin molded body has a same thickness as that of the upper member, and a topmost part of the hole of the resin molded body is coplanar with a topmost part of the upper member.

2. The electronic device according to claim 1, wherein, in the resin molded body, the first electronic component is embedded so that the external connection terminal of the first electronic component and the electrode of the second electronic component are aligned on the same surface.

3. The electronic device according to claim 1, wherein a plurality of second electronic components are provided and any electrode of the plurality of second electronic components is on the same surface as the bottom surface of the hole of the resin molded body.

4. The electronic device according to claim 1, wherein the resin molded body has an opening that is formed in an area in which the upper member is provided, and the resin molded body covers a bottom edge of the upper member.

5. The electronic device according to claim 1, wherein the first electronic component is a liquid crystal display device, the wiring substrate is an array substrate in which display electrodes are formed in an array shape, and the upper member comprises an upper substrate and a liquid crystal layer, the liquid crystal layer is provided between the upper substrate and the array substrate and comprises liquid crystal materials.

6. The electronic device according to claim 1, wherein the first electronic component is a substrate module, and the upper member comprises a mounted electronic component that is mounted on the wiring substrate and a protective member covering the mounted electronic component.

7. The electronic device according to claim 1, wherein the external connection terminal of the first electronic component and the electrode of the second electronic component are connected by a wiring on the bottom surface of the hole of the resin molded body.

8. The electronic device according to claim 7, wherein the wiring connection is formed by print printing a conductive material.

9. The electronic device according to claim 2, wherein a plurality of second electronic components are provided and any electrode of the plurality of second electronic components is on the same surface as the bottom surface of the hole of the resin molded body.

10. The electronic device according to claim 2, wherein the resin molded body has an opening that is formed in an area in which the upper member is provided, and the resin molded body covers a bottom edge of the upper member.

11. The electronic device according to claim 3, wherein the resin molded body has an opening that is formed in an area in which the upper member is provided, and the resin molded body covers a bottom edge of the upper member.

12. The electronic device according to claim 2, wherein the first electronic component is a liquid crystal display device, the wiring substrate is an array substrate in which display electrodes are formed in an array shape, and the upper member comprises an upper substrate and a liquid crystal layer, the liquid crystal layer is provided between the upper substrate and the array substrate and comprises liquid crystal materials.

13. The electronic device according to claim 3, wherein the first electronic component is a liquid crystal display device, the wiring substrate is an array substrate in which display electrodes are formed in an array shape, and the upper member comprises an upper substrate and a liquid crystal layer, the liquid crystal layer is provided between the upper substrate and the array substrate and comprises liquid crystal materials.

14. The electronic device according to claim 4, wherein the first electronic component is a liquid crystal display device, the wiring substrate is an array substrate in which display electrodes are formed in an array shape, and the upper member comprises an upper substrate and a liquid crystal layer, the liquid crystal layer is provided between the upper substrate and the array substrate and comprises liquid crystal materials.

15. The electronic device according to claim 2, wherein the first electronic component is a substrate module, and the upper member comprises a mounted electronic component that is mounted on the wiring substrate and a protective member covering the mounted electronic component.

16. The electronic device according to claim 2, wherein the external connection terminal of the first electronic component and the electrode of the second electronic component are connected by a wiring on the bottom surface of the hole of the resin molded body.

17. The electronic device according to claim 1, wherein the first electronic component has a stair portion with a step differences in the convex shape including a upper stair portion having the upper member and a lower stair portion having the wiring substrate, wherein at least a part of a top surface of the wiring substrate on which the upper member is mounted is exposed at the bottom surface of the hole of the resin molded body.

18. The electronic device according to claim 17, wherein a side surface of the upper member extending substantially perpendicularly from the upper member to the wiring substrate having the exposed part is exposed by the hole of the resin molded body.

19. The electronic device according to claim 1, wherein the first electronic component comprises a flowable liquid crystal material and the second electronic component comprises a material different from that of the first electronic component.

20. The electronic device according to claim 19, wherein the first electronic component comprises a liquid crystal display device and the second electronic component comprises at least one of a passive component, an active component, a power supply device, a display device, a sensor and a switch.

* * * * *